(12) United States Patent
Cheng

(10) Patent No.: US 12,690,221 B2
(45) Date of Patent: Jul. 21, 2026

(54) SEMICONDUCTOR STRUCTURE AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 456 days.

(21) Appl. No.: 18/322,716

(22) Filed: May 24, 2023

(65) Prior Publication Data

US 2023/0387287 A1 Nov. 30, 2023

(30) Foreign Application Priority Data

May 25, 2022 (CN) ......................... 202210583696.X

(51) Int. Cl.
H10D 30/47 (2025.01)
H10D 30/01 (2025.01)
(Continued)

(52) U.S. Cl.
CPC ....... H10D 30/4755 (2025.01); H10D 30/015 (2025.01); H10D 62/605 (2025.01); H10D 62/8503 (2025.01)

(58) Field of Classification Search
CPC ............. H10D 30/4755; H10D 30/015; H10D 62/605; H10D 62/8503; H10D 30/4732;
(Continued)

(56) References Cited

U.S. PATENT DOCUMENTS 6,329,677 B1 12/2001 Oguri
2013/0256681 A1 10/2013 Wang et al.
(Continued)

FOREIGN PATENT DOCUMENTS

CN 100375292 C 3/2008
CN 103633133 AA 3/2014
(Continued)

OTHER PUBLICATIONS

Office Action for corresponding CN Application No. 202210583696.X dated May 23, 2026 (15 pages).

*Primary Examiner* — Mohammad A Rahman
(74) *Attorney, Agent, or Firm* — Carroll, Hoette & Butscher, LLC; Christopher R. Carroll

(57) ABSTRACT

A semiconductor structure and a manufacturing method thereof are provided in the present application provides. The semiconductor structure includes a substrate and a heterojunction structure located on the substrate. The heterojunction structure includes a channel layer and a barrier layer located on the channel layer. The channel layer includes at least one n-type doped layer. The manufacturing method of the semiconductor structure includes: providing a substrate; forming a heterojunction structure on the substrate, where forming the heterojunction structure includes: forming a channel layer on the substrate, doping the channel layer to form an n-type doped layer; forming a barrier layer on the channel layer; forming a gate electrode, a source electrode and a drain electrode, the gate electrode is located on the heterojunction structure, and the source electrode and the drain electrode are located on two sides of the grid electrode, separately.

18 Claims, 8 Drawing Sheets

(51) Int. Cl.
   *H10D 62/60*        (2025.01)
   *H10D 62/85*        (2025.01)

(58) Field of Classification Search
   CPC .. H10D 30/475; H10D 62/228; H10D 62/149;
                                          H10D 62/60
   See application file for complete search history.

(56)                References Cited

U.S. PATENT DOCUMENTS

| | | | |
|---|---|---|---|
| 2021/0217883 A1* | 7/2021 | Jones | H10D 30/4732 |
| 2022/0059704 A1* | 2/2022 | Ku | H10D 30/6757 |

FOREIGN PATENT DOCUMENTS

| | | |
|---|---|---|
| CN | 111048586 A | 4/2020 |
| CN | 112837999 A | 5/2021 |
| JP | H06349860 A | 12/1994 |
| TW | I429076 B | 3/2014 |

* cited by examiner

SEMICONDUCTOR STRUCTURE AND MANUFACTURING METHOD THEREOF

CROSS REFERENCE TO RELATED APPLICATIONS

This application claims priority to Chinese Patent Application No. 202210583696.X filed on May 25, 2022, the entire content of which is incorporated herein by reference.

TECHNICAL FIELD

The present disclosure relates to the field of semiconductor, and more particular, to a semiconductor structure and a manufacturing method thereof.

BACKGROUND

High Electron Mobility Transistor (HEMT) is a field-effect transistor, where a heterojunction is formed by two materials with different bandgap, which provides channels for carriers. The two-dimensional electron gas (2DEG) formed by HEMT has high mobility and the HEMT has high output power.

The most important advantage of AlGaN/GaN-based HEMT is that it is applicable in high frequency and high power microwave devices and has a wide application prospect. With the increase of the dynamic range of the signal, the requirements for the linearity of the power amplifier in the base station circuit become higher and higher. However, the transconductance of the traditional AlGaN/GaN-based HEMT structure presents typical peak characteristics. At the condition of high frequency and high pressure, the concentration of 2DEG at the interface of AlGaN/GaN heterojunction is too high, which inhibits the electron mobility and saturation rate, that is, there is a compromise between carrier concentration and mobility. The decrease of electron mobility and saturation rate will cause a significant decrease in the transconductance of the transistor, resulting in problems of nonlinear transmission characteristics, signal distortion and so on.

SUMMARY

A semiconductor structure is provided in a first aspect of the present disclosure. The semiconductor structure includes:

a substrate; and a heterojunction structure located on the substrate, where the heterojunction structure includes a channel layer and a barrier layer located on the channel layer; and the channel layer includes at least one n-type doped layer.

In an embodiment, the semiconductor structure further includes: a gate electrode, a source electrode and a drain electrode, where the gate electrode is located on the barrier layer, and the source electrode and the drain electrode are located on two sides of the gate electrode separately.

In an embodiment, the channel layer includes a plurality of n-type doped layers, and the plurality of n-type doped layers are spaced in a direction of a thickness of the channel layer.

In an embodiment, doping concentrations of the plurality of n-type doped layers vary in gradient.

In an embodiment, in a direction where the substrate points towards the barrier layer, the doping concentrations of the plurality of n-type doped layers gradually decrease.

In an embodiment, in a direction where the substrate points towards the barrier layer, thicknesses of the plurality of n-type doped layers vary in gradient.

In an embodiment, at least one of the at least one n-type doped layer is a wide bandgap semiconductor layer including In element.

In an embodiment, in a direction where the substrate points towards the barrier layer, a content of In element in the at least one of the at least one n-type doped layer gradually decreases.

In an embodiment, the plurality of n-type doped layers are wide bandgap semiconductor layers comprising In elements; in a direction where the substrate points towards the barrier layer, contents of In element in the plurality of n-type doped layers gradually decrease.

In an embodiment, a lowest layer of the at least one n-type doped layer is located at an interface of the channel layer close to the substrate.

In an embodiment, the semiconductor structure further includes a back barrier layer located between the substrate and the heterojunction structure.

In an embodiment, the semiconductor structure further includes: a heavily doped n-type semiconductor layer, which is located at both sides of the heterojunction structure; where the heavily doped n-type semiconductor layer extends into the channel layer, and the source electrode and the drain electrode are located on the heavily doped n-type semiconductor layer.

In an embodiment, in a direction where the channel layer points towards the barrier layer, a width of the heavily doped n-type semiconductor layer varies in a gradient decrease, a linear decrease, or a combination of a gradient decrease and a linear decrease.

A manufacturing method of a semiconductor structure is provided in a second aspect of the present disclosure, including:

providing a substrate;

forming a heterojunction structure on the substrate, where forming the heterojunction structure on the substrate includes: forming a channel layer on the substrate, doping the channel layer to form at least one n-type doped layer, and forming a barrier layer on the channel layer; and forming a gate electrode, a source electrode and a drain electrode, where the gate electrode is located on the heterojunction structure, and the source electrode and the drain electrode are located on two sides of the gate electrode separately.

In an embodiment, a lowest layer of the n-type doped layer is located at an interface of the channel layer close to the substrate.

In an embodiment, where the channel layer includes a plurality of n-type doped layers, and the plurality of n-type doped layers are spaced in a direction of a thickness of the channel layer.

In an embodiment, where doping concentrations of the plurality of n-type doped layers vary in gradient, and/or thicknesses of the plurality of n-type doped layers vary in gradient.

In an embodiment, where at least one of the at least one n-type doped layer is a wide bandgap semiconductor layer including In element.

In an embodiment, the heterojunction structure includes a gate region, and the gate electrode is located on the gate region; after forming the heterojunction structure located on the substrate, the method further includes:

etching parts of the channel layer and the barrier layer located at two sides of the gate region;

laterally etching the channel layer further;

growing a heavily doped n-type semiconductor layer on a side of the channel layer and a side of the barrier layer; wherein the heavily doped n-type semiconductor layer (24) extends into the channel layer.

In an embodiment, in a direction where the channel layer points towards the barrier layer, a width of the heavily doped n-type semiconductor layer varies in a gradient decrease, a linear decrease, or a combination of a gradient decrease and a linear decrease.

DETAILED DESCRIPTION

The purpose of the present disclosure is to provide a semiconductor structure and a manufacturing method thereof, which can improve the linearity of the semiconductor structure. In order to make the above-mentioned objects, features and advantages of the present disclosure more obvious and understandable, embodiments of the present disclosure will be described in detail below with reference to the accompanying drawings.

Embodiment 1

Figure 1:
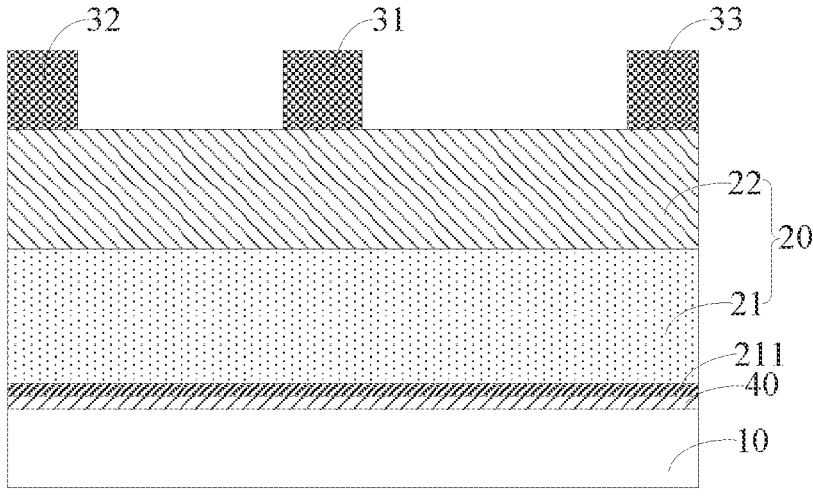
FIG. 1 is a structural diagram of a semiconductor structure according to a first embodiment of the present disclosure.

According to a first embodiment of the present disclosure, a semiconductor structure is provided. As shown in FIG. 1, the semiconductor structure includes a substrate 10, a heterojunction structure 20 located on the substrate 10, a gate electrode 31, a source electrode 32 and a drain electrode 33.

The heterojunction structure 20 includes a channel layer 21 and a barrier layer 22 located on the channel layer 21. 2DEG may be formed at the interface between the channel layer 21 and the barrier layer 22. The channel layer 21 includes at least one n-type doped layer 211. The gate electrode 31 is located on the heterojunction structure 20, and the source electrode 32 and the drain electrode 33 are located on two sides of the gate electrode 31 separately.

According to the semiconductor structure in the embodiment of the present disclosure, because the channel layer 21 of the heterojunction structure 20 includes at least one n-type doped layer 211, the energy band structure of the channel layer of the HEMT device can be adjusted by adjusting the thickness, doping concentration and material of the at least one n-type doped layer, so that the electron concentration in the channel below the gate electrode is more uniform with the increase of the gate voltage of the semiconductor structure. Therefore, the device degradation and signal transmission distortion of the semiconductor structure in high field can be alleviated, and the linearity of semiconductor structure can be improved.

In an embodiment, the material of the substrate 10 can include sapphire, silicon carbide, silicon or diamond.

In an embodiment, the semiconductor structure further includes a buffer layer 40 between the substrate 10 and the heterojunction structure 20, and the thickness of the buffer layer 40 is less than 1 μm. In this way, the effect of lattice defects in the buffer layer 40 on the quality of the epitaxial layer formed above the buffer layer 40 can be reduced.

Further, the thickness of the buffer layer 40 is less than 0.5 μm. In this way, the effect of lattice defects in the buffer layer 40 on the quality of the epitaxial layer formed above the buffer layer 40 can be reduced more effectively.

In some embodiments, the material of the buffer layer 40 can include AlN.

In an embodiment shown in FIG. 1, the channel layer 21 includes a n-type doped layer 211, which is located at an interface of the channel layer 21 close to the substrate 10, which helps to improve the linearity of the semiconductor structure. The n-type doped layer 211 is located at the interface of the channel layer 21 close to the substrate 10, that is, at the interface of the channel layer 21 in contact with the buffer layer 40.

In an embodiment, the n-type doped layer can be delta doping, modulated doping or uniformly doping. The n-type doped layer 211 can be formed by injecting n-type ions into the channel layer 21. The n-type ions can be selected from at least one kind of elements in the groups composed of Si, Se, Ge, Sn, Te and S. The concentration of n-type ions in n-type doped layer 211 can be greater than $1e10^{17}$ cm$^{-3}$.

The n-type doped layer of the present disclosure is in-situ doping, and via processes such as metal-organic chemical vapor deposition (MOCVD), molecular beam epitaxy (MBE), hydride vapor phase epitaxy (HYPE), plasma etching chemical vapor deposition (PECVD), etc., in which n-type impurity ions are inserted, implanted, annealed and segregated.

In an embodiment, the materials of the barrier layer 22, the channel layer 21 and the n-type doped layer 211 include wide band gap nitride semiconductor materials, but the specific materials are different.

In an embodiment, the barrier layer 22 is $Al_xGa_{1-x}N$, the channel layer 21 is $Al_yGa_{1-y}N$, and the n-type doped layer 211 is $Al_zGa_{1-z}N$, where x>y>z.

In an embodiment, the barrier layer 22 is AlGaN, the channel layer 21 is GaN, and the n-type doped layer 211 is GaN or InGaN.

In an embodiment, the material of the barrier layer 22 can be GaN-based material, and the band gap width of the barrier layer 22 is greater than that of the channel layer 21. The material of the barrier layer 22 can be AlGaN.

In an embodiment, the n-type doped layer 211 is made of a wide band gap semiconductor material including In element. The material and the band gap width of the n-type doped layer 211 are different from those of the region of the channel layer 21 where the channel layer 21 is not provided with the n-type doped layer. Therefore, the energy band of the channel layer 21 can be changed and the conduction band energy level of the channel layer 21 can be modulated. In this embodiment, due to the polarization, a sub 2DEG is formed at the interface between the n-type doped layer 211 and the region of the channel layer 21 where the n-type doped layer is not arranged, which affects the electron distribution in the channel layer 21 and ensures a better linearity of the semiconductor structure.

Further, the content of In element in the n-type doped layer 211 is gradually changed. By setting the In element content in the n-type doped layer 211 to be graded descent, the linearity of the semiconductor structure under high field can be improved by polarization-induced doping to form three-dimensional electron gas.

In an embodiment, the material of the gate electrode 31, the source electrode 32 and the drain electrode 33 can include metal, such as Ti/Al/Ni/Au, Ni/Au, etc.

In this embodiment, the source electrode 32 and the drain electrode 33 are also located on the heterojunction structure 20.

In this embodiment, the gate electrode 31, the source electrode 32 and the drain electrode 33 are all in contact with the barrier layer 22. In other embodiments, the source electrode 32 and the drain electrode 33 can also contact the channel layer 21.

Figure 2:
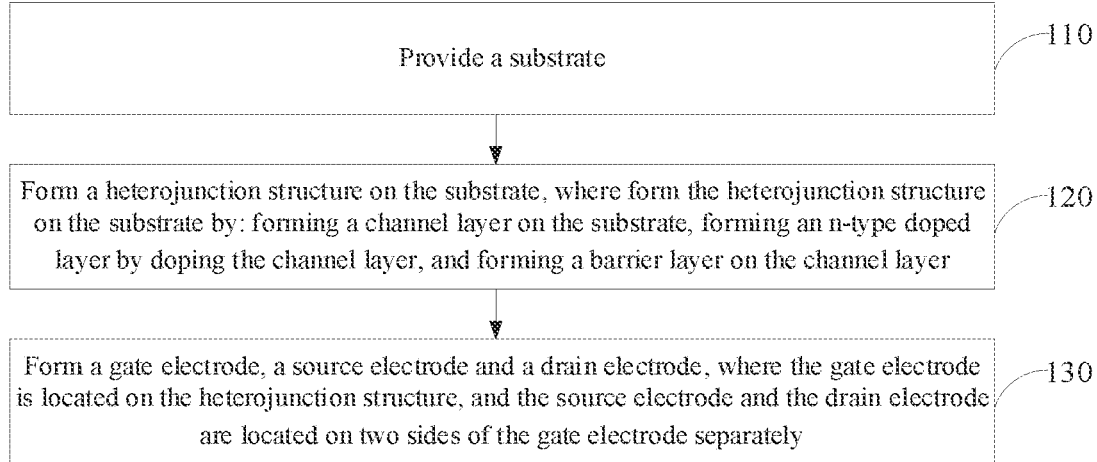
FIG. 2 is a flowchart of a method of manufacturing a semiconductor structure according to the first embodiment of the present disclosure.

According to a first embodiment of the present disclosure, a manufacturing method of a semiconductor structure is further provided. As shown in FIG. 2, the manufacturing method of the semiconductor structure includes steps 110 to 130 as follows. Each step will be described in detail below.

In step 110, a substrate is provided.

In an embodiment, the material of the substrate 10 can include sapphire, silicon carbide, silicon or diamond.

In step 120, a heterojunction structure is formed on the substrate, and the heterojunction structure is formed on the substrate by: forming a channel layer on the substrate, forming an n-type doped layer by doping the channel layer, and forming a barrier layer on the channel layer.

In an embodiment, before the channel layer is formed on the substrate, the manufacturing method further includes that: a buffer layer 40 is formed on the substrate 10; where the thickness of the buffer layer 40 is less than 1 μm.

In an embodiment, the channel layer 21 includes a n-type doped layer 211, where the n-type doped layer 211 is located at an interface of the channel layer 21 close to the substrate 10. The n-type doped layer 211 is located at the interface of the channel layer 21 in contact with the buffer layer 40.

In an embodiment, the n-type doped layer 211 is a wide band gap semiconductor layer including In element.

Further, the content of In element in the n-type doped layer 211 is gradually changed.

Further, the material of the n-type doped layer 211 includes InGaN.

In step 130, a grid electrode, a source electrode and a drain electrode are formed, and the grid electrode is located on the heterojunction structure, the source electrode and the drain electrode are located on two sides of the grid electrode separately.

In an embodiment, the grid electrode, the source electrode and the drain electrode can be formed by physical vapor deposition or chemical vapor deposition. The grid electrode, the source electrode and the drain electrode can be formed simultaneously in the same process step.

In this embodiment, the source electrode 32 and the drain electrode 33 are also located on the heterojunction structure 20.

In this embodiment, the gate electrode 31, the source electrode 32 and the drain electrode 33 are all in contact with the barrier layer 22. In other embodiments, the source electrode 32 and the drain electrode 33 can also contact the channel layer 21.

The semiconductor structure and the manufacturing method of the semiconductor structure provided in the embodiment of the present disclosure belong to the same concept, and the relevant details and beneficial effects can be described mutually.

Embodiment 2

Figure 3:
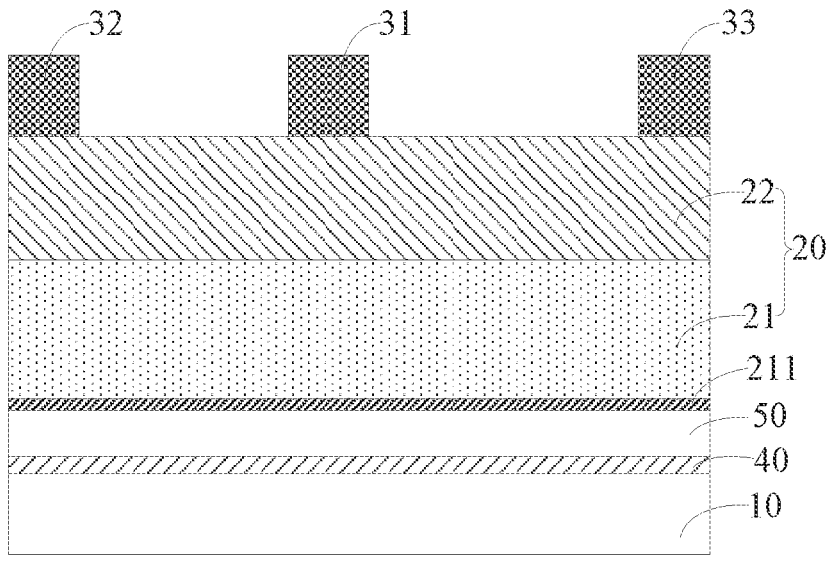
FIG. 3 is a structural diagram of a semiconductor structure according to a second embodiment of the present disclosure.

A semiconductor structure is provided in a second embodiment of the present disclosure. The semiconductor structure in the second embodiment of the present disclosure is substantially the same as that in the first embodiment. The difference includes that, as shown in FIG. 3, the semiconductor structure further includes a back barrier layer 50 between the substrate 10 and the heterojunction structure 20. Specifically, when the n-type doped layer 211 is a wide bandgap semiconductor layer including In elements, the back barrier layer 50 can be located between the n-type doped layer 211 and the buffer layer 40. By providing the back barrier layer 50, the energy level difference between the channel layer 21 after modulation and the buffer layer 40 can be increased, thus reducing the influence from the polarization electric field on the electronic channel mobility, and effectively improving the linearity and other properties of the semiconductor structure.

In an embodiment, the band gap width of the back barrier layer 50 is greater than that of the channel layer 21. In an embodiment, the band gap width of the back barrier layer 50 is also greater than that of the buffer layer 40.

In an embodiment, the material of the back barrier layer 50 includes at least one of GaN, AlGaN or AlN. The back barrier layer 50 can be p-type doped.

Embodiment 3

Figure 4:
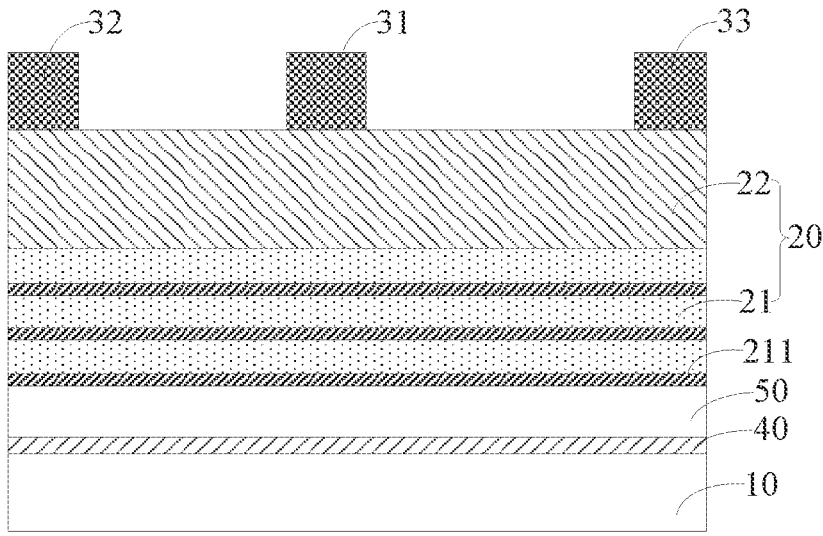
FIG. 4 is a structural diagram of a semiconductor structure according to a third embodiment of the present disclosure.
Figure 5:
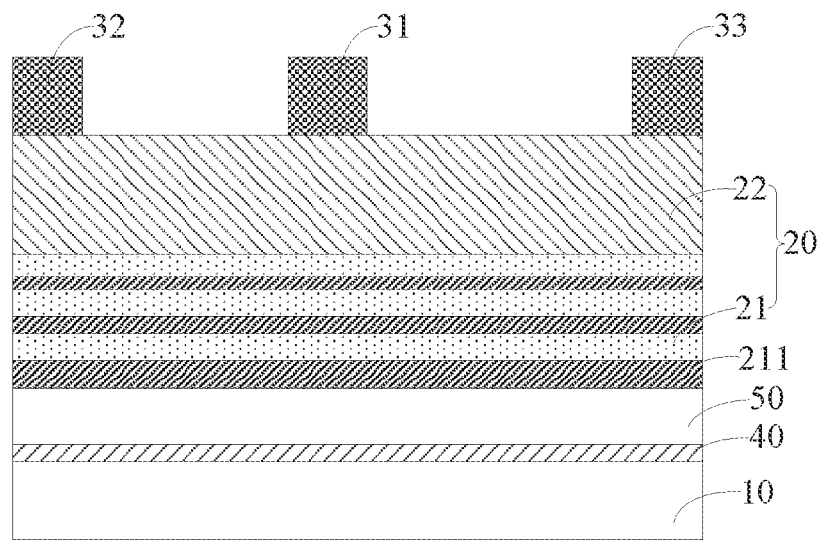
FIG. 5 is a structural diagram of another semiconductor structure according to the third embodiment of the present disclosure.

A semiconductor structure is provided in a third embodiment of the present disclosure. The semiconductor structure provided in the third embodiment of the present disclosure is shown in FIG. 4 and FIG. 5. The semiconductor structure in the third embodiment of the present disclosure is substantially the same as that in the second embodiment. The difference includes that the channel layer 21 includes multiple n-type doped layers 211, which are spaced in the thickness direction of the channel layer 21. By arranging the channel layer 21 including multiple n-type doped layers 211, the energy band structure of the channel layer 21 of the HEMT device can be adjusted by adjusting the thicknesses, doping concentrations and materials of the multiple n-type doped layers, so that the electron concentration in the channel below the gate electrode is more uniform with the increase of the gate voltage of the semiconductor structure. Therefore, the device degradation and signal transmission distortion of semiconductor structure in high field can be alleviated, and the linearity of the semiconductor structure can be improved. By arranging multiple n-type doped layers 211 in the channel layer 21, multiple n-type doped layers 211 form multiple discrete energy levels in the channel layer 21, and the electrons can be distributed at different discrete energy levels to avoid the accumulation of electrons in the channel layer 21 when the semiconductor structure works in a high field, so as to make the distribution of electrons more uniform, thus improving the linearity of the semiconductor structure.

In an embodiment, the lowest layer of the multiple n-type doped layers 211 is located at the interface of the channel layer 21 close to the substrate 10. In the embodiments shown in FIG. 4 and FIG. 5, the lowest layer of the multiple n-type doped layers 211 is in contact with the back barrier layer 50 directly.

In an embodiment, as shown in FIG. 4, the thicknesses of multiple n-type doped layers 211 of the channel layer 21 can be the same. Alternatively, as shown in FIG. 5, the thicknesses of multiple n-type doped layers 211 in the channel layer 21 can be different.

In an embodiment, as shown in FIG. 5, when the thicknesses of the multiple n-type doped layers 211 in the channel layer 21 are not the same, the thicknesses of the multiple n-type doped layers 211 can vary in a gradient. The thickness of n-type doped layer 211 can be less than 10 nm; In an embodiment, the thickness of the n-type doped layer 211 is less than 2 nm, for example, 1 nm or less than 1 nm; In an embodiment, the thickness of the n-type doped layer is a size of several atoms.

Further, in the direction where the substrate 10 points towards the barrier layer 22, the thicknesses of the multiple n-type doped layers 211 gradually decrease. The thickness difference of the two adjacent n-type doped layers 211 can be the same or be different. Alternatively, in the direction where the substrate 10 points towards the barrier layer 22, the thicknesses of the multiple n-type doped layers 211 gradually increase.

Figure 6:
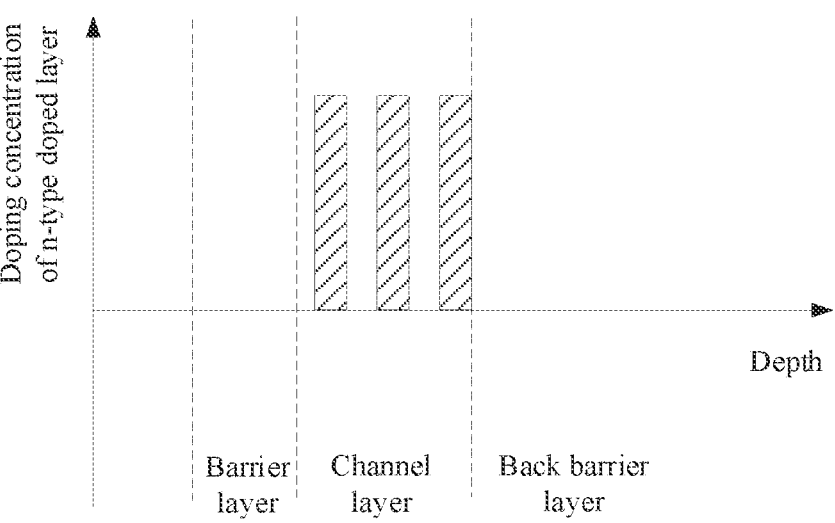
FIG. 6 is a schematic diagram of doping concentrations of a plurality of n-type doped layers in a channel layer of a semiconductor structure according to the third embodiment of the present disclosure.

In an embodiment, as shown in FIG. 6, in the direction where the substrate 10 points towards the barrier layer 22, the doping concentrations of the multiple n-type doped layers 211 are approximately the same.

In another embodiment, the doping concentrations of the multiple n-type doped layers 211 vary in gradient.

Figure 7:
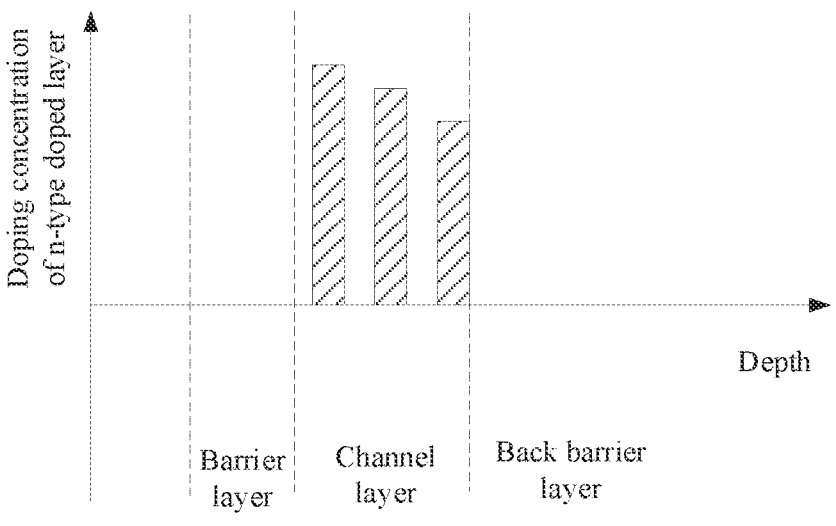
FIG. 7 is a schematic diagram of doping concentrations of a plurality of n-type doped layers in a channel layer of another semiconductor structure according to the third embodiment of the present disclosure.

In an embodiment, as shown in FIG. 7, in the direction where the substrate 10 points towards the barrier layer 22, the doping concentrations of the multiple n-type doped layers 211 gradually increase.

Figure 8:
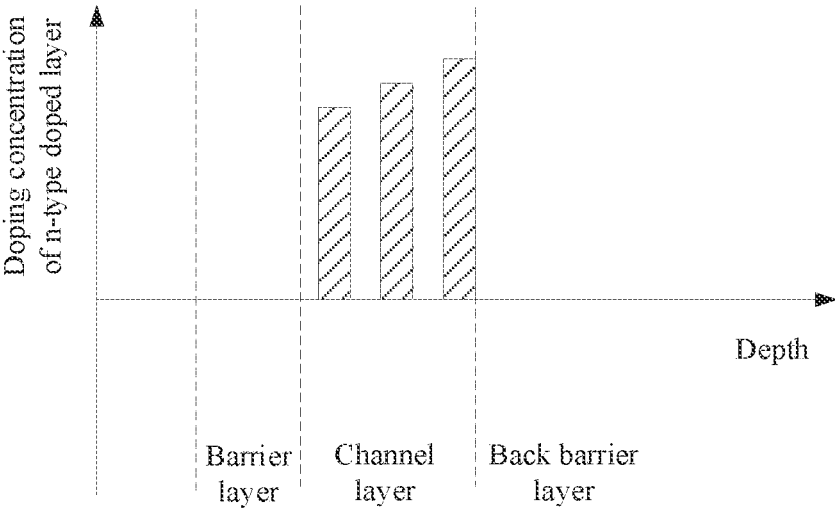
FIG. 8 is a schematic diagram of doping concentrations of a plurality of n-type doped layers in a channel layer of another semiconductor structure according to the third embodiment of the present disclosure.

In an embodiment, as shown in FIG. 8, in the direction where the substrate 10 points towards the barrier layer 22, the doping concentrations of the multiple n-type doped layers 211 gradually decrease.

Figure 9:
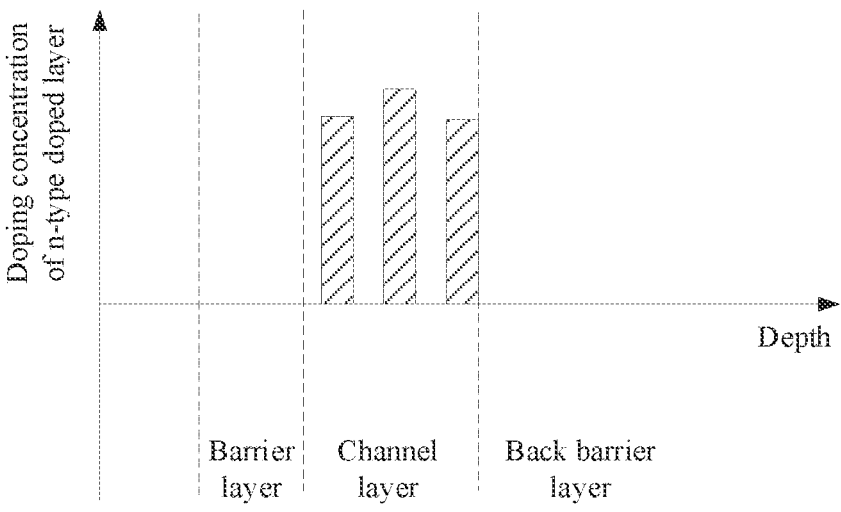
FIG. 9 is a schematic diagram of doping concentrations of a plurality of n-type doped layers in a channel layer of another semiconductor structure according to the third embodiment of the present disclosure.

In another embodiment, as shown in FIG. 9, in the direction where the substrate 10 points towards the barrier layer 22, the doping concentrations of the multiple n-type doped layers 211 increase first and then decrease. The heights of the columnar shadows in FIGS. 6 to 9 represent the doping concentrations of the n-type doped layers 211.

The n-type doped layer 211 can change the energy band of an epitaxial layer on the n-type doped layer 211. In this present disclosure, the channel layer 21 includes multiple n-type doped layers 211, which make the energy band of the channel layer 21 bend; the higher the doping concentration of the n-type doped layer 211, the greater the gradient of energy level of the channel layer 21 along the thickness direction and the greater the degree of energy band bending of the channel layer 21; the lower the doping concentration of the n-type doped layer 211, the smaller the gradient of energy level of the channel layer 21 along the thickness direction and the smaller the degree of energy band bending of the channel layer 21. In the direction where the substrate 10 points towards the barrier layer 22, the doping concentrations of multiple n-type doped layers 211 in the channel layer 21 gradually decrease, that is, the farther away from the barrier layer 22, the lower the conduction band energy level of the channel layer 21, which makes the conduction band energy level of the channel layer 21 less than the Fermi level when the semiconductor structure works, reduces the longitudinal current, expands the channel width, and makes the electron distribution in the channel layer 21 more uniform, thus improving the linearity of the semiconductor structure. By arranging multiple n-type doped layers 211 with different doping concentrations, the energy band offsets can be different, which can further increase the freedom of the modulation device.

Figure 10:
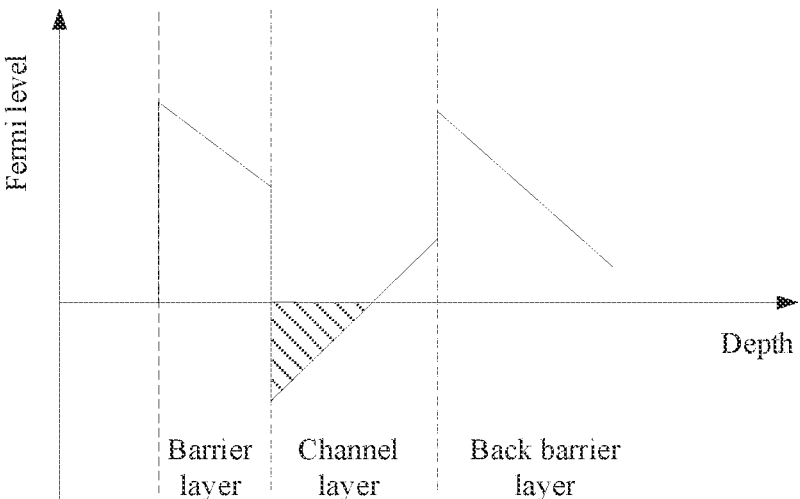
FIG. 10 is an energy band diagram of a semiconductor structure according to an embodiment of the present disclosure.
Figure 11:
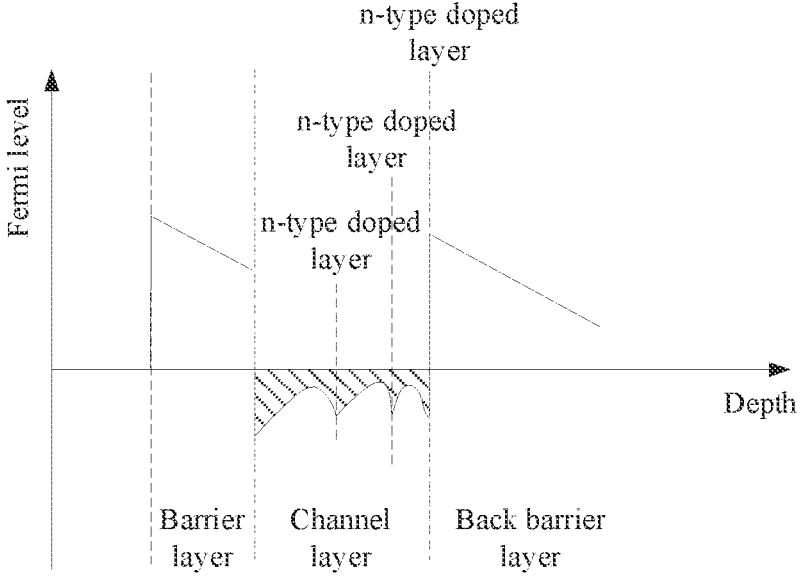
FIG. 11 is an energy band diagram of a semiconductor structure according to the third embodiment of the present disclosure.

FIG. 10 is an energy band diagram of a semiconductor structure (the channel layer does not include an n-type doped layer, and other structures are the same as those shown in FIG. 4 or FIG. 5). FIG. 11 is an energy band diagram of the semiconductor structure shown in FIG. 4 and FIG. 5. The shaded areas in FIG. 10 and FIG. 11 represent the conduction bands of the channel layers. Compared with FIG. 10 and FIG. 11, it can be seen that in the semiconductor structure provided in the embodiment of the present disclosure, the arrangement of the n-type doped layer 211 in the channel layer 21 causes the conduction band energy level of the channel layer 21 to drop at the position where the n-type doped layer 211 is, and the arrangement of multiple n-type doped layers 211 causes the energy band of the channel layer 21 to bend. Since the electron concentration in the channel layer 21 is proportional to the area enclosed by the conduction band and the Fermi level, the arrangement of the n-type doped layer 211 in the channel layer 21 makes the semiconductor structure with the increase of the gate voltage, the electron concentration in the channel layer 21 below the gate electrode is more uniform, thus alleviating the device degradation and signal transmission distortion of the semiconductor structure in the high field, and improving the linearity of the semiconductor structure.

Embodiment 4

A semiconductor structure is provided in a fourth embodiment of the present disclosure. The semiconductor structure provided in the fourth embodiment of the present disclosure is shown in FIG. 4. The semiconductor structure in the fourth embodiment of the present disclosure is substantially the same as that in the second embodiment. The difference includes that the channel layer 21 includes multiple n-type doped layers 211, which are spaced in the thickness direction of the channel layer 21, and at least one of the n-type doped layers 211 is a wide band gap semiconductor layer including In elements.

Further, the content of In element in at least one of the n-type doped layers 211 gradually changes. At least one n-type doped layer 211 as a wide band gap semiconductor including In element is arranged, where the material and the band gap width of the n-type doped layer 211 are different from those of the region of the channel layer 21 not provided with the n-type doped layer. Therefore, the energy band of the channel layer 21 can be changed and the conduction band energy level of the channel layer 21 can be modulated. In this embodiment, due to the polarization, a sub 2DEG is formed at the interface between the n-type doped layer 211 and the region of the channel layer 21 where the n-type doped layer is not arranged, which affects the electron distribution in the channel layer 21 and ensures a better linearity of the semiconductor structure.

In an embodiment, the In element content in at least one of the n-type doped layers gradually decreases. In this way, the linearity of semiconductor structure in high field can be improved by polarization-induced doping to form three-dimensional electron gas.

In an embodiment, the multiple n-type doped layers 211 are wide band gap semiconductors including In element.

In an embodiment, in the direction where the substrate 10 points towards the barrier layer 22, the contents of In in the multiple n-type doped layers 211 are approximately the same.

In an embodiment, in the direction where the substrate 10 points towards the barrier layer 22, the contents of In in the multiple n-type doped layers 211 increase gradually.

In an embodiment, in the direction where the substrate 10 points towards the barrier layer 22, the contents of In in the multiple n-type doped layers 211 decrease gradually.

In an embodiment, in the direction where the substrate 10 points towards the barrier layer 22, the contents of In in the multiple n-type doped layers 211 increase first and then decrease.

Figure 12:
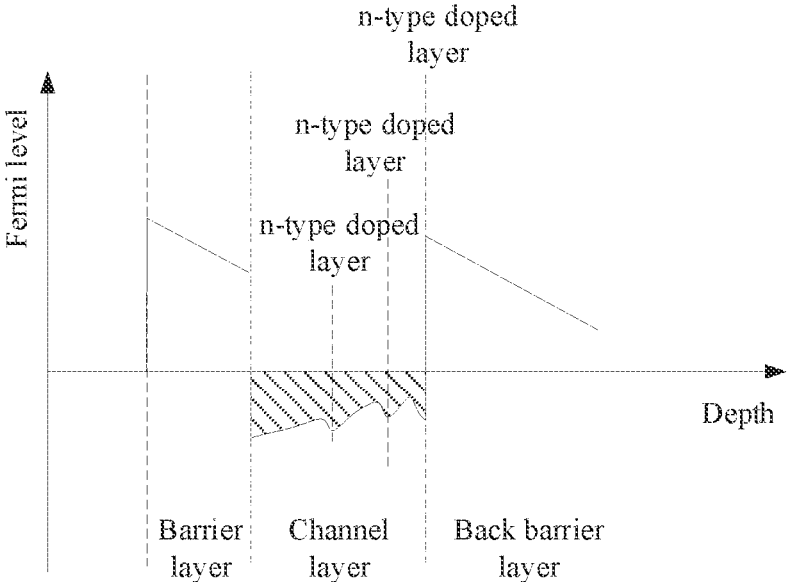
FIG. 12 is an energy band diagram of a semiconductor structure according to the fourth embodiment of the present disclosure.

When each of n-type doped layers 211 in the semiconductor structure shown in FIG. 4 is a wide band gap semiconductor layers including In element, the energy band diagram is shown in FIG. 12. The shaded areas in FIG. 12 represent the conduction bands of the channel layer. Compared with FIG. 10 and FIG. 12, it can be seen that because the material and band gap of the n-type doped layer 211 in the channel layer 21 are different from those of the region of the channel layer 21 without the n-type doped layer 211, the arrangement of multiple n-type doped layers causes the conduction band energy levels of the channel layer 21 to drop at the corresponding positions where the n-type doped layers are arranged, which can change the energy band of the channel layer 21 and achieve the function of modulating the conduction band energy level of the channel layer 21; due to the polarization, a sub 2DEG is formed at the interface between the n-type doped layer 211 in the channel layer 21 and the region of the channel layer 21 without the n-type doped layer, which affects the electron distribution in the channel layer 21 and ensures a better linearity of the semiconductor structure.

Embodiment 5

Figure 13:
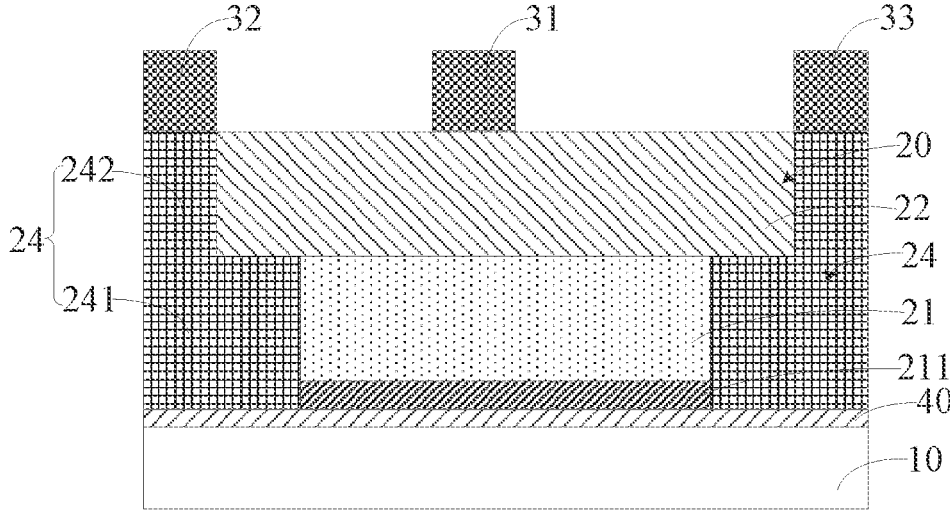
FIG. 13 is an energy band diagram of a semiconductor structure according to a fifth embodiment of the present disclosure.
Figure 14:
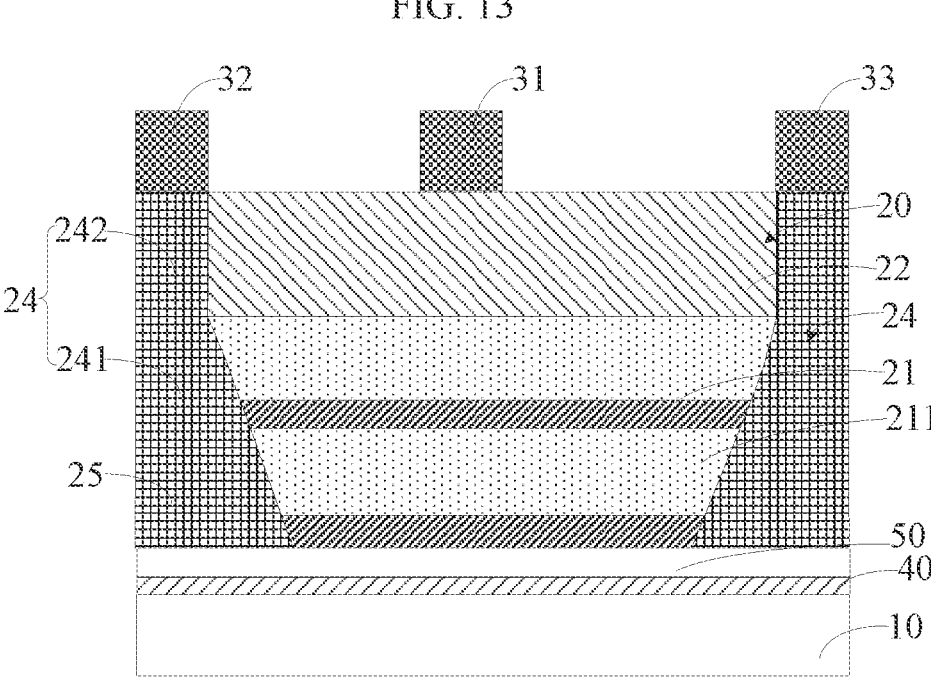
FIG. 14 is a structural diagram of another semiconductor structure according to the fifth embodiment of the present disclosure.
Figure 15:
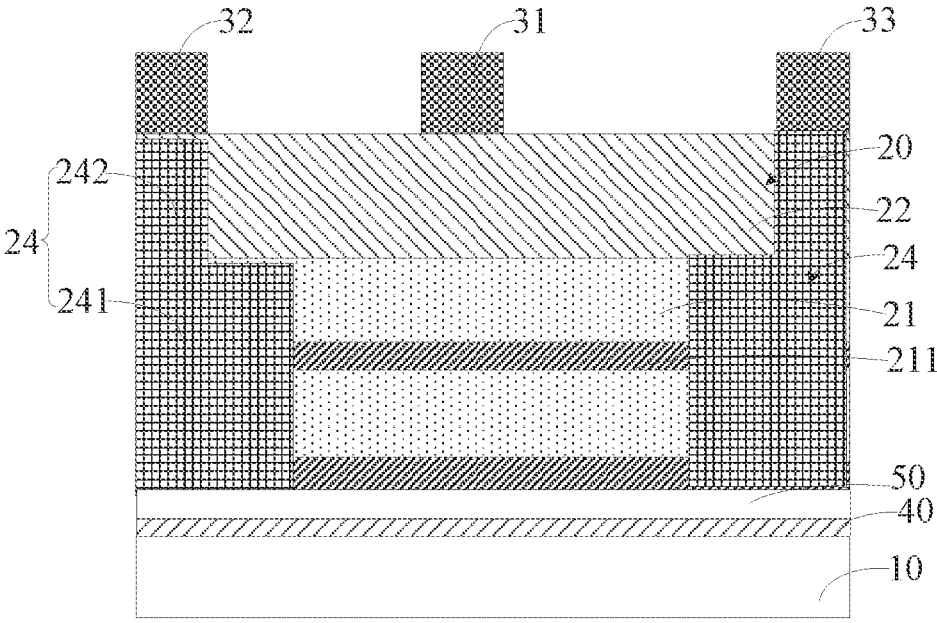
FIG. 15 is a structural diagram of another semiconductor structure according to the fifth embodiment of the present disclosure.

A semiconductor structure is provided in a fifth embodiment of the present disclosure. The semiconductor structure provided in the fifth embodiment of the present disclosure is shown in FIG. 13 to FIG. 15. The semiconductor structure in the fifth embodiment of the present disclosure is substantially the same as that in the first embodiment, the difference includes that:

the semiconductor structure further includes a heavily doped n-type semiconductor layer 24, which is located at least on both sides of the heterojunction structure 20; the heavily doped n-type semiconductor layer 24 extends into the channel layer 21; the source electrode 32 and the drain electrode 33 are located on the heavily doped n-type semiconductor layer 24. In this way, the contact resistance between the heavily doped n-type semiconductor layer 24 and the heterojunction structure 20 can be reduced, and the series resistance between the source electrode 32 and the drain electrode 33 can be reduced.

In an embodiment of the present disclosure, in the direction where the channel layer 21 points towards the barrier layer 22, the width of the heavily doped n-type semiconductor layer 24 varies in a gradient decrease, a linear decrease, or a combination of a gradient decrease and a linear decrease. In this way, the contact resistance between the heavily doped n-type semiconductor layer 24 and the heterojunction structure 20 can be further reduced, and the series resistance between the source electrode 32 and the drain electrode 33 can be further reduced.

As shown in FIG. 13, when the heterojunction structure 20 is in direct contact with the buffer layer 40, the lower surface of the heavily doped n-type semiconductor layer 24 is in direct contact with the buffer layer 40. The side surface, towards to heterojunction structure 20, of the heavily doped n-type semiconductor layer 24 is in direct contact with the channel layer 21 and the barrier layer 22. The heavily doped n-type semiconductor layer 24 includes a first portion 241 located in the same layer as the channel layer 21 and a second portion 242 located in the same layer as the barrier layer 22. The width of the first portion 241 is greater than the width of the second portion 242.

As shown in FIGS. 14 and 15, when a back barrier layer 50 is formed between the heterojunction structure 20 and the buffer layer 40, the lower surface of the heavily doped n-type semiconductor layer 24 is in direct contact with the back barrier layer 50. The side surface, towards to heterojunction structure 20, of the heavily doped n-type semiconductor layer 24 is in direct contact with side surfaces of the channel layer 21 and the barrier layer 22. The heavily doped n-type semiconductor layer 24 includes a first portion 241 located in the same layer as the channel layer 21 and a second portion 242 located in the same layer as the barrier layer 22. The width of the first portion 241 is greater than the width of the second portion 242.

In an embodiment of the present disclosure, in the direction where the channel layer 21 points towards the barrier layer 22, the width of the heavily doped n-type semiconductor layer 24 varies in a gradient decrease, a linear decrease, or a combination of a gradient decrease and a linear decrease.

As shown in FIGS. 13 and 15, in the direction where the substrate 10 points towards the barrier layer 22, the width of the heavily doped n-type semiconductor layer 24 decreases in gradient. The width of the first part 241 is identical everywhere, and the width of the second part 242 is identical everywhere. The width of the first part 241 is greater than the width of the second part 242.

As shown in FIG. 14, in the direction where the substrate 10 points towards the barrier layer 22, the width of the heavily doped n-type semiconductor layer 24 decreases linearly. The width of the first portion 241 decreases linearly, and the width of the second portion 242 is identical everywhere; the minimum width of the first portion 241 is equal to the width of the second portion 242.

A manufacturing method of a semiconductor structure is also provided in a fifth embodiment of the present disclosure. The manufacturing method of the semiconductor structure in the fifth embodiment of the present disclosure is substantially the same as the manufacturing method of the semiconductor structure in the first embodiment. The difference includes that:

the heterojunction structure includes a gate region, and a gate electrode is on the gate region. After the step 120 of forming a heterojunction structure on the substrate, the manufacturing method of the semiconductor structure further includes the following process:

first, parts of the channel layer 21 and the barrier layer 22 located at two sides of the gate region are etched;

subsequently, the channel layer 21 is further laterally etched;

then, the heavily doped n-type semiconductor layer 24 is grown on the side of the channel layer 21 and the side of the barrier layer 22; the heavily doped n-type semiconductor layer 24 extends into the channel layer 21.

In an embodiment of the present disclosure, in the direction where the channel layer 21 points towards the barrier layer 22, the width of the heavily doped n-type semiconductor layer varies in a gradient decrease, a linear decrease, or a combination of a gradient decrease and a linear decrease.

In this embodiment, in the step of etching the parts of the channel layer 21 and the barrier layer 22 located at two sides of the gate region, the parts of the channel layer 21 and the barrier layer 22 located at the same side of the gate region are etched out with the same width, or with different widths. In the embodiments shown in FIGS. 13 to 15, the parts of the channel layer 21 and the barrier layer 22 located at the same side of the gate region are etched with different widths.

In this embodiment, in the step of further lateral etching the channel layer 21, in the direction where the substrate 10 points to the heterojunction structure 20, the width of the etched part of the channel layer 21 can be identical or gradually decreased. In the process of manufacturing the semiconductor structures shown in FIGS. 13 and 15, in the step of further lateral etching the channel layer 21, in the direction where the substrate 10 points to the heterojunction structure 20, the width of the etched part of the channel layer 21 is identical. In the process of manufacturing the semiconductor structures shown in FIG. 14, in the step of further lateral etching the channel layer 21, in the direction where the substrate 10 points to the heterojunction structure 20, the width of the etched part of the channel layer 21 is gradually decreased.

In some embodiments, the material of the heavily doped n-type semiconductor layer 24 includes GaN.

According to the semiconductor structure and the manufacturing method thereof in the embodiment of the present disclosure, because the channel layer of the heterojunction structure includes at least one n-type doped layer, the energy band structure of the channel layer of the HEMT device can be adjusted by adjusting the thickness, doping concentration and material of the at least one n-type doped layer, so that the electron concentration in the channel below the gate electrode is more uniform with the increase of the gate voltage of the semiconductor structure. Therefore, the device degradation and signal transmission distortion of semiconductor structure in high field can be alleviated, and the improvement of linearity of semiconductor structure can be realized.

In the semiconductor structure and the manufacturing method thereof previously described, the channel layer of the heterojunction structure includes multiple n-type doped layers, the energy band structure of the channel layer of the HEMT device can be adjusted by adjusting the thicknesses, doping concentrations and materials of the multiple n-type doped layer, so that the electron concentration in the channel below the gate electrode is more uniform with the increase of the gate voltage of the semiconductor structure. Therefore, the device degradation and signal transmission distortion of semiconductor structure in high field can be alleviated, and the improvement of linearity of semiconductor structure can be realized.

In the semiconductor structure and the manufacturing method previously described, by arranging multiple n-type doped layers in the channel layer, multiple n-type doped layers form multiple discrete energy levels in the channel layer, and the electrons can be distributed at different discrete energy levels to avoid the accumulation of electrons in the channel layer when the semiconductor structure works in a high field, so as to make the distribution of electrons more uniform, thus achieving the goal of improving the linearity of the semiconductor structure.

In the semiconductor structure and the manufacturing method thereof previously described, the n-type doped layer can change the energy band of a layer structure on the n-type doped layer. In this present disclosure, the channel layer includes multiple n-type doped layers, which make the energy band of the channel layer bend; the higher the doping concentration of n-type dopant layer, the greater the gradient of energy level along the thickness direction of channel layer and the greater the degree of energy band bending of channel layer; the lower the doping concentration of n-type doped layer 211, the smaller the gradient of energy level along the thickness direction of channel layer 21 and the smaller the degree of energy band bending of channel layer 21. In the direction where the substrate 10 points towards the barrier layer 22, the doping concentrations of multiple n-type doped layers 211 in the channel layer 21 gradually decrease, that is, the farther away from the barrier layer 22, the lower the conduction band energy level of the channel layer 21, which makes the conduction band energy level of the channel layer 21 less than the Fermi level when the semiconductor structure works, reduces the longitudinal current, expands the channel width, and makes the electron distribution in the channel layer 21 more uniform, thus improving the linearity of the semiconductor structure. By arranging multiple n-type doped layers 211 with different doping concentrations, the energy band offsets can be different, which can further increase the freedom of the modulation device.

In the semiconductor structure and the manufacturing method thereof previously described, at least one n-type doped layer as a wide band gap semiconductor including In element is arranged, where the material and the band gap width of the n-type doped layer are different from those of the region where the channel layer is not provided with the n-type doped layer. Therefore, the energy band of the channel layer can be changed and the conduction band energy level of the channel layer can be modulated. In this embodiment, due to the polarization, a sub 2DEG is formed at the interface between the n-type doped layer and the region of the channel layer where the n-type doped layer is not arranged, which affects the electron distribution in the channel layer and ensures a better linearity of the semiconductor structure.

In the semiconductor structure and the manufacturing method thereof previously described, in the direction where the substrate points towards the potential barrier layer, due to the In contents of the multiple n-type doped layers decrease layer-by-layer; and/or the In content of at least one of the multiple n-type doped layers gradually decreased, the linearity of semiconductor structure in high field can be improved by polarization-induced doping to form three-dimensional electron gas. However, the surface density of three-dimensional electron gas or three-dimensional hole gas is small, resistance of pathway series between source electrode and drain electrode is large, and the alloy scattering in the channel is relative serious, which limits the carrier mobility and the current density of the device.

In the semiconductor structure and the manufacturing method thereof previously described, by arranging that the heavily doped n-type semiconductor layer is located on both sides of the heterojunction structure and the heavily doped n-type semiconductor layer extends into the channel layer, the contact resistance between the n-type heavily doped semiconductor layer and the heterojunction structure is reduced, in addition, resistance of pathway series between source electrode and drain electrode is also reduced.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

What is claimed is:

1. A semiconductor structure, comprising:
a substrate; and
a heterojunction structure located on the substrate, wherein the heterojunction structure comprises a channel layer and a barrier layer located on the channel layer; and the channel layer comprises at least one n-type doped layer;
wherein a lowest layer of the at least one n-type doped layer is located at an interface of the channel layer close to the substrate.

2. The semiconductor structure according to claim 1, further comprising: a gate electrode, a source electrode and a drain electrode, wherein the gate electrode is located on the barrier layer, and the source electrode and the drain electrode are located on two sides of the gate electrode separately.

3. The semiconductor structure according to claim 1, wherein the channel layer comprises a plurality of n-type doped layers, and the plurality of n-type doped layers are spaced in a direction of a thickness of the channel layer.

4. The semiconductor structure according to claim 3, wherein doping concentrations of the plurality of n-type doped layers vary in gradient.

5. The semiconductor structure according to claim 4, wherein in a direction where the substrate points towards the barrier layer, the doping concentrations of the plurality of n-type doped layers gradually decrease.

6. The semiconductor structure according to claim 3, wherein in a direction where the substrate points towards the barrier layer, thicknesses of the plurality of n-type doped layers vary in gradient.

7. The semiconductor structure according to claim 1, wherein at least one of the at least one n-type doped layer is a wide bandgap semiconductor layer comprising In element.

8. The semiconductor structure according to claim 7, wherein in a direction where the substrate points towards the barrier layer, a content of In element in the at least one of the at least one n-type doped layer gradually decreases.

9. The semiconductor structure according to claim 3, wherein the plurality of n-type doped layers are wide bandgap semiconductor layers comprising In elements; in a direction where the substrate points towards the barrier layer, contents of In element in the plurality of n-type doped layers gradually decrease.

10. The semiconductor structure according to claim 1, wherein the semiconductor structure further comprises a back barrier layer located between the substrate and the heterojunction structure.

11. The semiconductor structure according to claim 2, further comprising:
a heavily doped n-type semiconductor layer, which is located at both sides of the heterojunction structure; wherein the heavily doped n-type semiconductor layer extends into the channel layer, and the source electrode and the drain electrode are located on the heavily doped n-type semiconductor layer.

12. The semiconductor structure according to claim 11, wherein in a direction where the channel layer points towards the barrier layer, a width of the heavily doped n-type semiconductor layer varies in a gradient decrease, a linear decrease, or a combination of a gradient decrease and a linear decrease.

13. A method of manufacturing semiconductor substrate, comprising:
providing a substrate;
forming a heterojunction structure on the substrate, wherein forming the heterojunction structure on the substrate comprises: forming a channel layer on the substrate, doping the channel layer to form at least one n-type doped layer, and forming a barrier layer on the channel layer; and
forming a gate electrode, a source electrode and a drain electrode, wherein the gate electrode is located on the heterojunction structure, and the source electrode and the drain electrode are located on two sides of the gate electrode separately;
wherein a lowest layer of the at least one n-type doped layer is located at an interface of the channel layer close to the substrate.

14. The method according to claim 13, wherein the channel layer comprises a plurality of n-type doped layers, and the plurality of n-type doped layers are spaced in a direction of a thickness of the channel layer.

15. The method according to claim 14, wherein at least one of: doping concentrations of the plurality of n-type doped layers vary in gradient, or thicknesses of the plurality of n-type doped layers vary in gradient.

16. The method according to claim 13, wherein at least one of the at least one n-type doped layer is a wide bandgap semiconductor layer comprising In element.

17. The method according to claim 13, wherein the heterojunction structure comprises a gate region, and the gate electrode is located on the gate region; after forming the heterojunction structure located on the substrate, the method further comprises:
etching parts of the channel layer and the barrier layer located at two sides of the gate region;
laterally etching the channel layer further;
growing a heavily doped n-type semiconductor layer on a side of the channel layer and a side of the barrier layer;

wherein the heavily doped n-type semiconductor layer extends into the channel layer.

18. The method according to claim 17, wherein in a direction where the channel layer points towards the barrier layer, a width of the heavily doped n-type semiconductor layer varies in a gradient decrease, a linear decrease, or a combination of a gradient decrease and a linear decrease.

\* \* \* \* \*